(12) United States Patent
Rumpler, II et al.

(10) Patent No.: US 9,071,030 B2
(45) Date of Patent: Jun. 30, 2015

(54) HIGHLY INTEGRABLE SEMICONDUCTOR DEVICE

(71) Applicants: Joseph John Rumpler, II, Mountain View, CA (US); Clifton Fonstad, Jr., Arlington, MA (US)

(72) Inventors: Joseph John Rumpler, II, Mountain View, CA (US); Clifton Fonstad, Jr., Arlington, MA (US)

( * ) Notice: Subject to any disclaimer, the term of this patent is extended or adjusted under 35 U.S.C. 154(b) by 109 days.

(21) Appl. No.: 13/774,855

(22) Filed: Feb. 22, 2013

(65) Prior Publication Data

US 2014/0328362 A1 Nov. 6, 2014

Related U.S. Application Data

(62) Division of application No. 12/826,676, filed on Jun. 30, 2010, now Pat. No. 8,409,888.

(60) Provisional application No. 61/222,020, filed on Jun. 30, 2009.

(51) Int. Cl.
| | |
|---|---|
| *H01S 5/00* | (2006.01) |
| *H01S 5/02* | (2006.01) |
| *H01S 5/32* | (2006.01) |
| *B82Y 20/00* | (2011.01) |
| *H01S 5/30* | (2006.01) |
| *H01S 5/50* | (2006.01) |
| *H01S 5/343* | (2006.01) |

(52) U.S. Cl.
CPC ............. *H01S 5/0202* (2013.01); *H01S 5/0206* (2013.01); *H01S 5/3202* (2013.01); *B82Y 20/00* (2013.01); *H01S 5/0201* (2013.01); *H01S 5/021* (2013.01); *H01S 5/0216* (2013.01); *H01S 5/0217* (2013.01); *H01S 5/3434* (2013.01); *H01S 5/3013* (2013.01); *H01S 5/50* (2013.01)

(58) Field of Classification Search
CPC ... H01S 5/0217; H01S 5/0206; H01S 5/3202; H01S 5/0202; H01S 5/0201; H01S 5/3013
USPC .................................. 372/50.1, 44.01, 43.01
See application file for complete search history.

(56) References Cited

U.S. PATENT DOCUMENTS

| | | | |
|---|---|---|---|
| 7,400,663 B2 * | 7/2008 | Shi | 372/43.01 |
| 7,839,909 B2 * | 11/2010 | Shveykin | 372/44.01 |
| 2009/0147812 A1 * | 6/2009 | Shveykin | 372/44.01 |

* cited by examiner

*Primary Examiner* — Kinam Park

(57) ABSTRACT

Described herein is a novel technique used to make novel thin III-V semiconductor cleaved facet edge emitting active optical devices, such as lasers and optical amplifiers. These fully processed laser platelets with both top side and bottom side electrical contacts can be thought of as freestanding optoelectronic building blocks that can be integrated as desired on diverse substrates for a number of applications, many of which are in the field of communications. The thinness of these platelets and the precision with which their dimensions are defined using the process described herein makes it conducive to assemble them in dielectric recesses on a substrate, such as silicon, as part of an end-fire coupled, coaxial alignment optoelectronic integration strategy. This technology has been used to integrate edge emitting lasers onto silicon substrates, a significant challenge in the field of silicon optoelectronics.

20 Claims, 15 Drawing Sheets

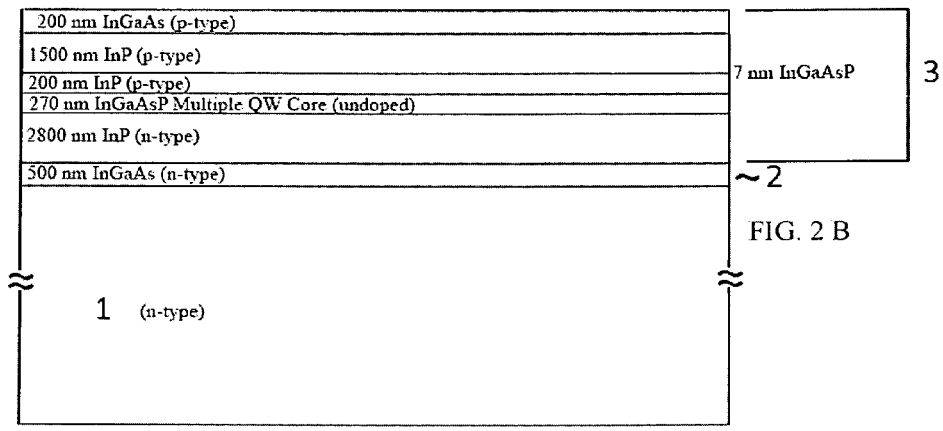
FIG. 3
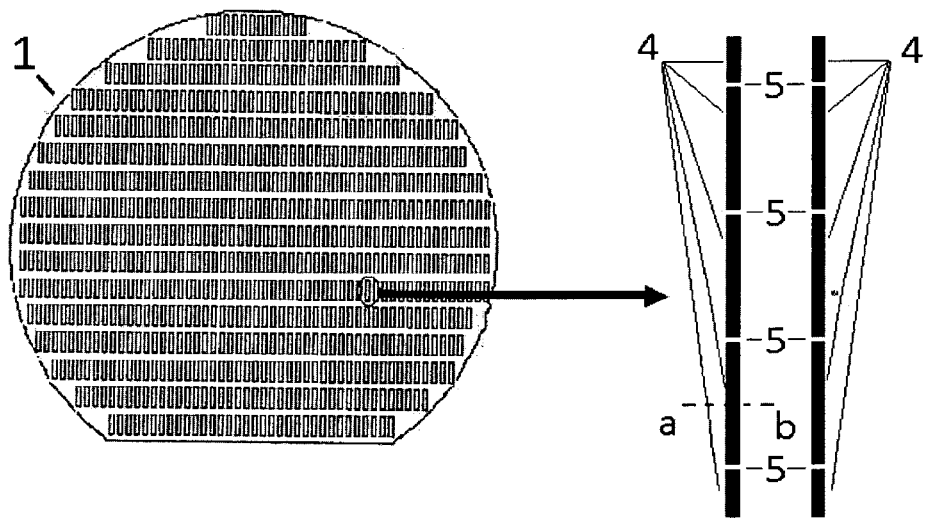

FIG. 6
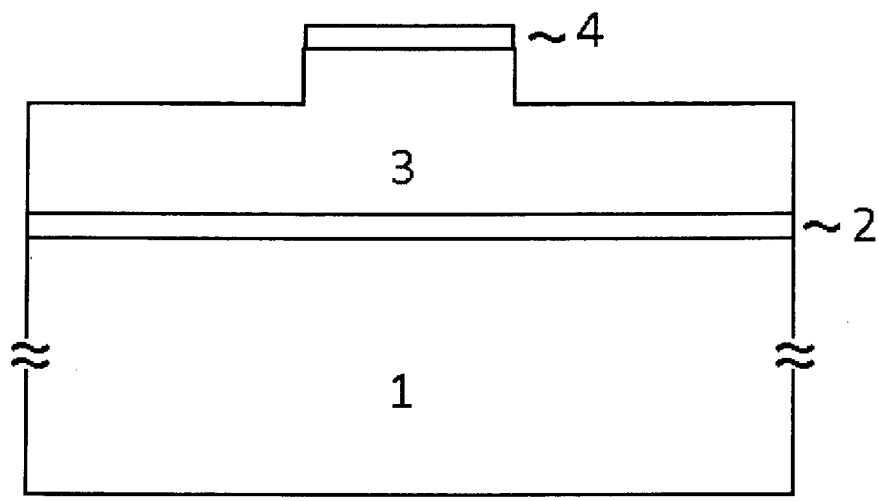
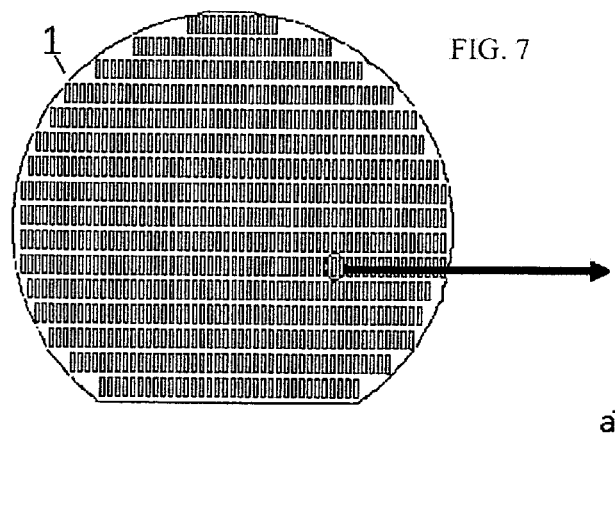
FIG. 7

Cleaved Facets

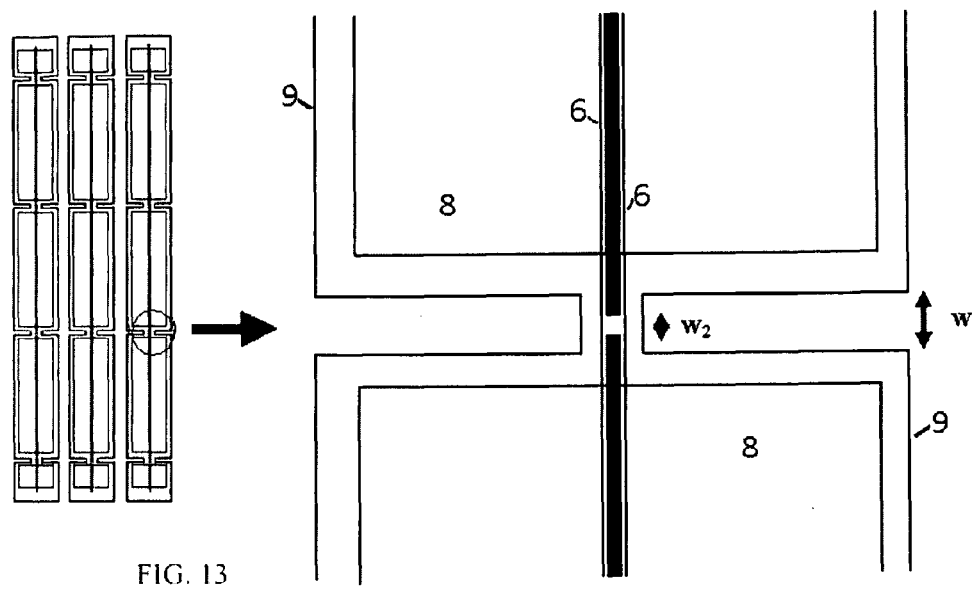
FIG. 13
FIG. 14A  FIG. 14B  FIG. 14C
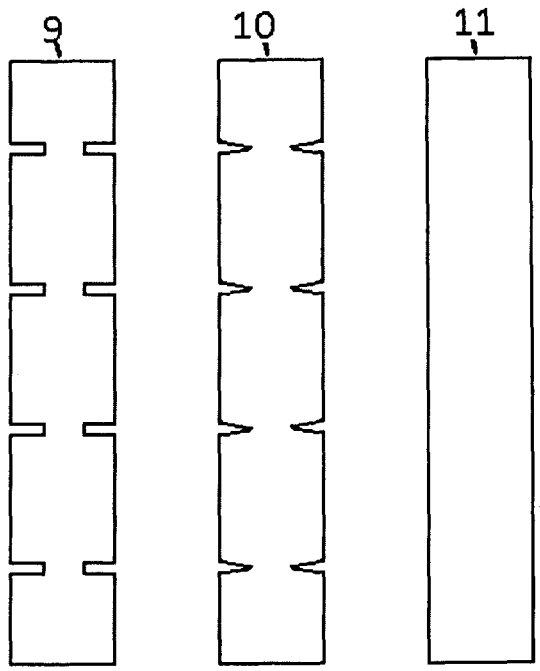

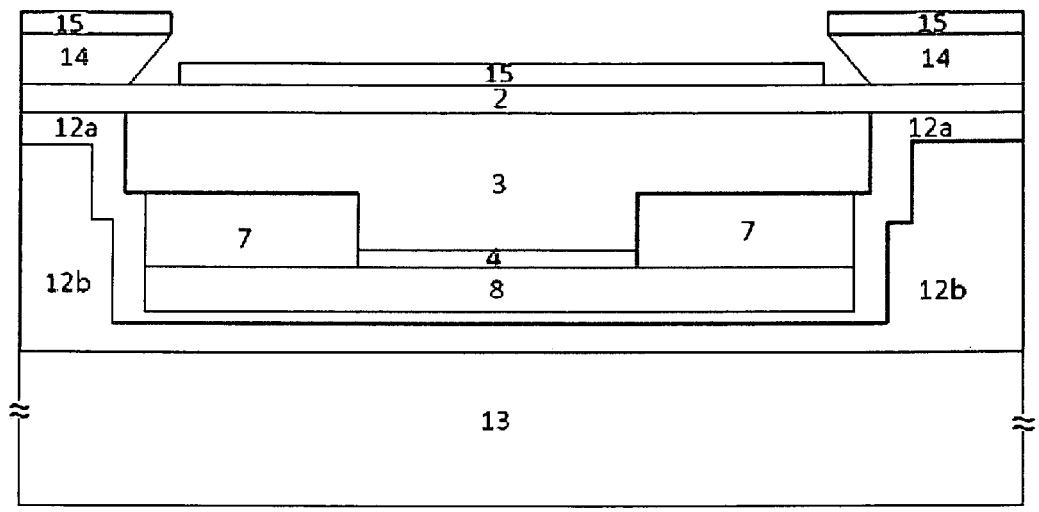
FIG. 20
FIG. 21
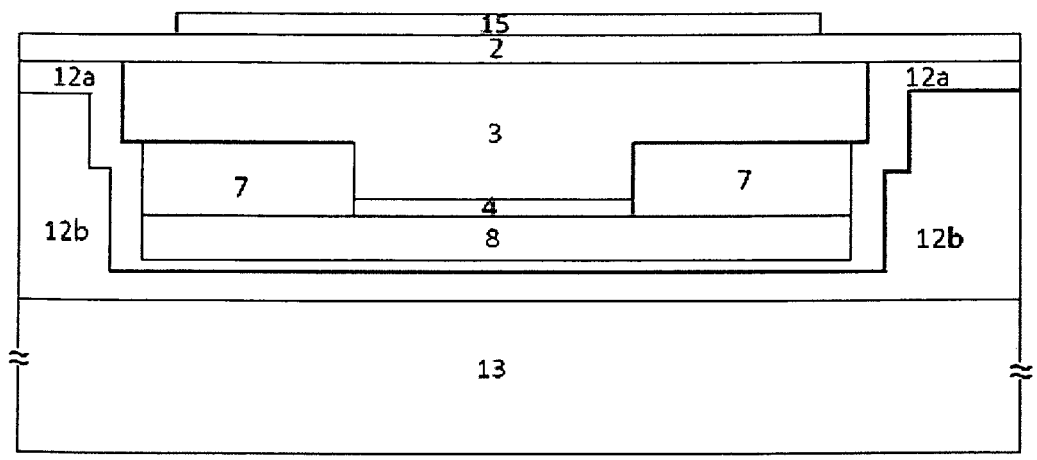

Top-down view        Side view

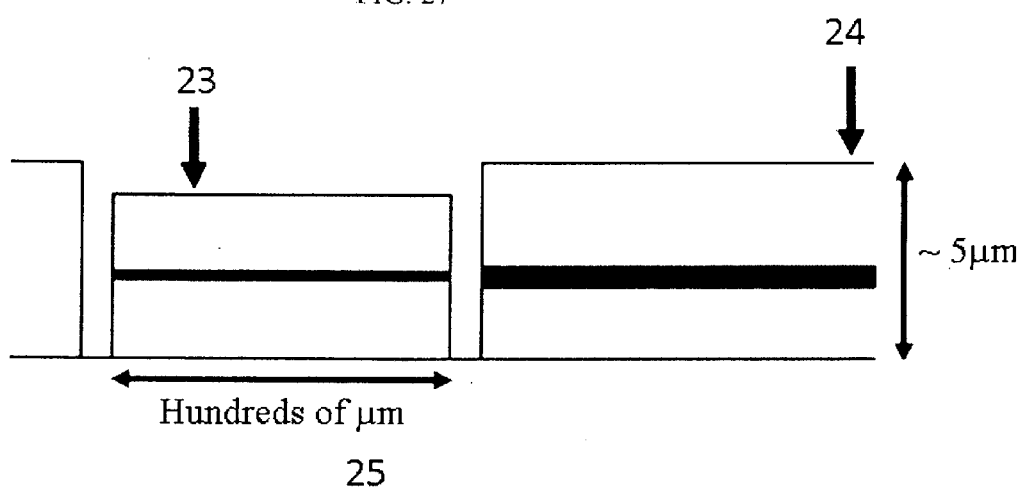

HIGHLY INTEGRABLE SEMICONDUCTOR DEVICE

CROSS-REFERENCE TO RELATED APPLICATIONS

This patent application is a divisional of patent application Ser. No. 12/826,676. This patent application claims benefit of prior U.S. Provisional Patent Application Ser. No. 61/222,020, filed Jun. 30, 2009 by Joseph J. Rumpler et al. for HIGHLY INTEGRABLE EDGE EMITTING ACTIVE OPTICAL DEVICE AND A PROCESS FOR MANUFACTURE OF THE SAME.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

BACKGROUND OF THE INVENTION

The present invention is in the technical field of semiconductors. In particular, this invention relates to highly integrable edge emitting active optical devices such as lasers, optical amplifiers and the like, and the manufacture of the same.

For over forty years, silicon has been the material of choice for high density microelectronics in large part because of the performance advantages of high speed, low static power complementary metal oxide semiconductor (CMOS) technology. With the maturity of silicon fabrication processes gained over this time, and the ever-increasing prominence of silicon devices in the marketplace, a significant area of research in the field of optoelectronics has been to integrate both active and passive optoelectronic devices directly on silicon substrates.

Silicon based compounds are regularly used to make passive optical devices such as waveguides, splitters, couplers, and wave division multiplexers. In fact, silicon, and silicon based materials, such as silicon dioxide, silicon nitride, and silicon oxy-nitride, are widely used materials used in commercial optical planar waveguides today. The development of silicon active optical devices like lasers and optical amplifiers, however, has proved to be much more challenging. The difficulty lies in the fact that silicon is an inefficient light emitting material due to its indirect energy band gap. Silicon laser research efforts have investigated ways to circumvent this limitation by using materials such as nanoporous silicon (See, e.g., Kojima et al., Applied Physics Letters 87 (2005)), rare-earth doped silica glasses (See, e.g., deWaal et al., Applied Physics Letters 71, 2922-2924 (1997); deWaal et al., IEEE Phot. Tech. Letters 16, 194-196 (2004)), silicon nanocrystals (See, e.g., Pavesi et al. Nature 408, 440-441 (2000)) and-strained germanium on silicon (See, e.g., Michel et al, IEEE J. Select. Topics in Quant. Electron. 12, 1628-1635 (2006)), or have exploited phenomena such as the Raman Effect (See, e.g., Rong et al., Nature 433, 725-727 (2005)). Although these demonstrations represent tremendous breakthroughs, each of these approaches requires an additional laser to pump the devices and achieve light emission. To make silicon the material of choice for monolithic optoelectronic integration, the development of an efficient electrically pumped active optical device is necessary.

Given the difficulty of manufacturing electrically pumped silicon based active optical devices of sufficient quality, an alternative approach involving the hybrid integration of III-V semiconductor and silicon substrates has been considered. One prior art approach has involved the epitaxy, chemical vapor deposition, or growth of III-V based semiconductors directly onto a silicon substrate. This growth process is then commonly followed by processing that attempts to transform the semiconductor material into a working active optical device. A common problem with this approach is that there are both lattice constant and thermal expansion coefficient mismatches between the III-V based semiconductor and silicon that result in significant stresses in the semiconductors. Alternatively, another prior art approach has involved the bonding of III-V based semiconductors directly onto silicon substrates followed by processing that attempts to transform the semiconductor material into a working active optical device. With this approach, the thermal expansion coefficient mismatch is a common problem since the bonding occurs at elevated temperatures.

A key requirement for any process used to manufacture an active optical device, such as an edge emitting laser, is that it results in smooth, end facets. Smooth facets help to minimize problems such as facet heating and promote ideal characteristics such as low current threshold operation. The ideal laser facet is one that has been cleaved along one of the natural cleavage planes of the semiconductor crystal from which the laser is made. The location of cleavage planes in semiconductors can be due to a variety of factors, such as favorable atomic densities along certain planes (e.g., Silicon) or electrical surface neutrality conditions (e.g., Gallium Arsenide, Indium Phosphide) (See, e.g., Siemans et al., Phys. Rev. B, 59(4): 3000-3007, (1999)). (100) InP and (100) GaAs substrates, upon which the majority of semiconductor lasers are grown, most easily cleave in two dimensions, one that is parallel to the plane of the wafer flat, and the other dimension which is perpendicular to the wafer flat.

The facets for active optical devices, such as lasers, optical amplifiers, and the like, are conventionally formed using cleaving tools. These cleaving tools use scribing and/or mechanical forces to cause the semiconductor to smoothly break along the cleavage plane. Unfortunately, these techniques can locate the cleave position to a precision of no better than 5 microns (See, e.g., Marsh et al., J. of Crystal Growth, 288, Iss. 1, 2-6 (2006)), which severely hampers control of the laser cavity length. The control of the length of a laser cavity is extremely important in many applications. For instance, the laser cavity length can affect the optical emission properties of the device. In addition, in cases where the goal is to integrate the active optical devices with other devices, it is often desirable to have very precise control of the device dimensions. As an example, one way to integrate laser diodes and other active semiconductor devices within silicon-based photonic integrated circuits (PICs) is to use micro-scale hybrid integration and co-axial alignment. This approach involves fabricating in-plane active optical device building blocks, such as laser diodes and optical amplifiers, in the form of thin platelets and assembling these thin devices in dielectric recesses formed to intersect waveguides in a PIC fabricated on silicon wafers, or other substrates. By coaxially aligning the active optical devices with the waveguides of the PIC, very efficient coupling between the active devices and the photonic circuitry can be achieved. This concept is illustrated in FIG. 27, which shows the integration of an edge emitting laser block 23 with a dielectric waveguide 24 on silicon 25.

Low-loss coaxial coupling involves the direct alignment of the active device and waveguide in both the horizontal and vertical planes with little or no gap between the active device and waveguide facets. The dimensions of the waveguide, active optical device, and recess formed on the silicon platform must all be precisely controlled since the alignment accuracy is the major determinant of the resulting coupling efficiency.

The vertical offset between the active optical device and dielectric waveguides can easily be kept small, because the layers that comprise the dielectric waveguides and the semiconductor active optical devices can all be deposited with precise thickness control by, for example, using plasma enhanced chemical vapor deposition (PECVD) to deposit the dielectrics, and metal organic chemical vapor deposition (MOCVD) or molecular beam epitaxy (MBE) to grow the semiconductor heterostructures. The horizontal offset between the non-light emitting, receiving, or transmitting sides of laser and waveguide is also straightforward to control because the widths of the dielectric recesses and the laser platelets can be controlled precisely using modern photolithography and vertical dry etching. The length of the recesses is similarly straightforward to control.

The more difficult challenge with the coaxial coupling integration strategy is the accurate and consistent dimensioning of the length of the edge emitting laser which allows the gap between the laser and waveguide facets to be kept small As mentioned earlier, conventional cleaving tools used to produce laser facets can locate the cleave with a precision of no better than ±5 microns, which in turn means the laser cavity length can vary as much as 20 microns. Since the recess must accommodate the longest devices, some conventionally cleaved device platelets will be this much shorter than the recess.

An additional problem with conventional cleaving methods is that the mechanical nature of these cleaving processes does not allow for reliable cleaving of thin-film semiconductors (i.e., tens of microns or thinner). Thin film semiconductor devices are especially desirable for integration with other devices.

An alternative to cleaving facets, is to etch low loss highly reflective optical facets. In fact, several companies, as mentioned in Behfar et al., SPIE Optoelectronics Magazine, 27-29 (2005) have commercialized their facet etching processes. The main drawback with facet etching, though, is that unlike cleaving, etching seems to invariably impart roughness on the facets and does not result in an ideal facet.

BRIEF SUMMARY OF THE INVENTION

This invention relates to highly integrable electrically pumped continuous-wave III-V semiconductor edge emitting active optical devices, such as lasers, optical amplifiers and the like, and the process used to manufacture the same by a new approach enabling the production of platelet active optical devices with cleaved facets and precisely defined lengths. The technology allows for the use of a good thermally conducting material in the interface between the semiconductor active optical device and the substrate on which the device is ultimately integrated. This should have significant benefits for the high temperature operation and lifetime of the device. The process technology described is highly modular so that it can be applied to wide varieties of devices, materials, and substrates; it is also well suited for integrating lasers operating at different wavelengths on the same substrate.

The process described herein overcomes the limitations of the aforementioned techniques by: (1) enabling the creation of very thin-film devices, that have both well-controlled cavity lengths and mirror smooth cleaved facets, that exhibit continuous-wave lasing operation and (2) removing the need for manual mechanical forces to induce cleaving such as flexing of a substrate or scribing. This process (3) allows for the full processing of thin integrable laser devices including the incorporation of front-side and back-side ohmic electrical contacts prior to facet cleaving. Moreover, (4) the resulting devices can have very small footprint with very low electrical current thresholds and can be integrated on diverse substrates.

BRIEF DESCRIPTION OF THE SEVERAL VIEWS OF THE DRAWING

FIG. 3 is a view of the alignment of ohmic metal contact strips 4 to the top-side of the laser semiconductor epitaxial structure of the present invention;

FIG. 6 is a view of the cross section taken at the line a-b shown in FIG. 5 after the wafer was patterned using the mask shown in FIG. 5 and the mask was removed;

FIG. 7 is a view of the alignment of the large area electrical contact 8 on top of the ohmic metal contact strips;

FIG. 13 is a top-down close-up view of a cleaved facet enabling bar pattern 9 with rectangular notches applied to an edge emitting ridge laser and labeling of the appropriate notch dimensions;

FIG. 14A shows the bar pattern 9 with rectangular notches locating the position of the cleave;

FIG. 14B is a view of a bar pattern 10 with v-shaped notches that are used to locate the position of the cleave;

FIG. 14C shows a bar pattern 11 with no notches;

FIG. 20 is a cross-sectional view of a bar in the area a-b shown in FIG. 9 after the backside contact metal deposition;

FIG. 21 is a cross-sectional view of a bar in the area a-b shown in FIG. 9 after the backside contact photolithography liftoff process;

FIG. 27 is a schematic showing the recess integration of an edge emitting laser 23 with a dielectric waveguide 24 on silicon 25.

DETAILED DESCRIPTION OF THE INVENTION

In the following, an embodiment of the semiconductor edge emitting laser platelet process in accordance with the present invention will be explained with reference to the accompanying figures. The description herein refers to the use of Indium Phosphide as the material from which the laser is manufactured. This technology applies equally well to other materials, such as Gallium Arsenide, that have a similar crystal structure.

Figure 1:
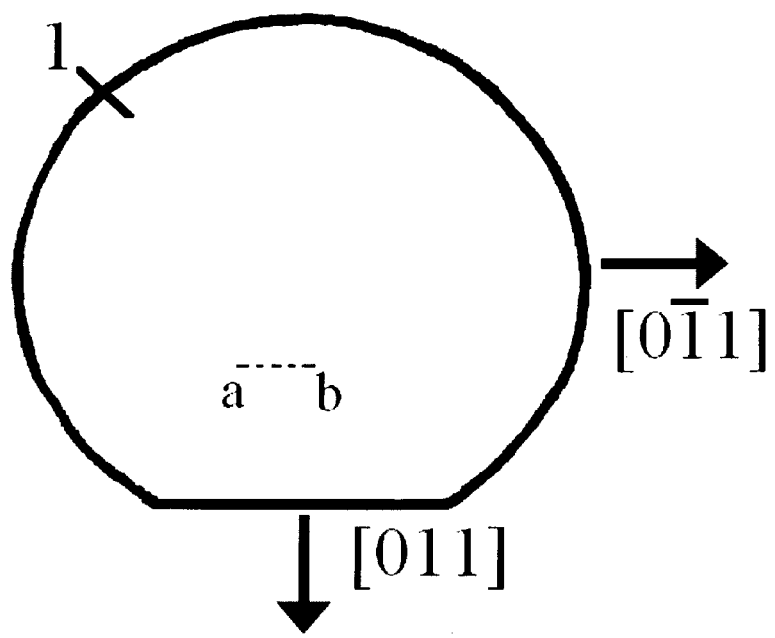
FIG. 1 is a view of the starting (100) oriented semiconductor wafer with cleavage directions [011] and [0$\bar{1}$1] labeled and upon which has been grown a semiconductor laser structure.
Figure 2:
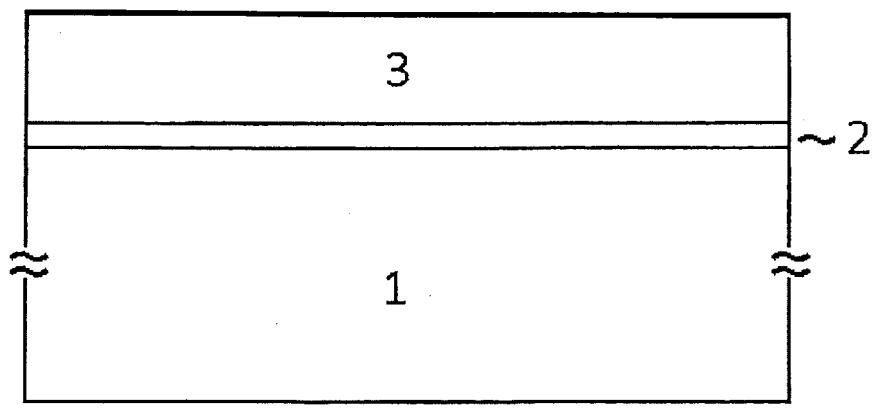
FIG. 2A is a view of the cross-section taken at the line a-b shown in FIG. 1.
FIG. 2B is the same view as shown in FIG. 2A except with more detail of an example of the layers that could comprise the semiconductor laser layer structure.

FIG. 1 is a view of the (100)-oriented InP wafer 1 (which is hundreds of microns thick) upon which has been grown an edge emitting laser epitaxial structure. The wafer crystal orientation is chosen since the cleavage planes lie along the (011) and (011) planes, or in other words, the orthogonal directions on a (100)-oriented wafer. FIG. 2A is a view of the cross section of the wafer shown in FIG. 1, taken along the line a-b. Between the semiconductor laser layer structure 3 and the InP substrate, there is a thin (i.e., a few hundred to several hundred nanometers thick) intermediate layer 2. In the case of an InP-based laser structure, a logical choice for this intermediate layer is InGaAs. This layer will ultimately be used in the process to allow for the separation of the thin-film laser from its native Iridium Phosphide substrate. The actual laser semiconductor layer structure 3 is composed of InP based materials such as InGaAsP quaternaries and InGaAs ternaries. FIG. 2B provides an example of the semiconductor laser structure that could be used. The invention described here does not require this specific layer structure. The only requirements are that there is an intermediate layer 2 between the substrate 1 and the laser layer structure 3.

Figure 4:
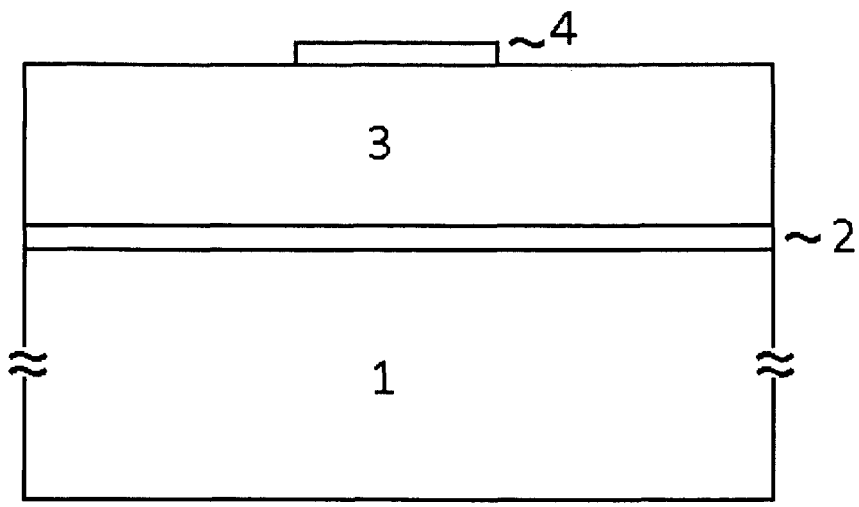
FIG. 4 is a view of the cross section taken at the line a-b shown in FIG. 3.

The invention is designed to be non-restrictive with regards to the front-side processing that can be performed. A rudimentary front-side device process that can be used to make the edge emitting ridge lasers is now described in order to illustrate an implementation of the invention. First, long (e.g., approximately 300 microns for long middle contact strips 4 and approximately 75 microns for short end contact strips 4 as shown in FIG. 3.) and narrow (e.g., narrower than 10 microns) Ti (30 nm thick)/Pt (20 nm thick)/Au (250 nm thick) ohmic metal contacts 4 to the p-type top side of the laser epitaxial structure are formed by a lift-off process. The top-down view schematic of the wafer after this electrical contact formation process is shown in FIG. 3. FIG. 4 is a cross-sectional view through the line a-b in FIG. 3. The contact strips 4 are aligned in one of two possible directions, either in a direction parallel with or perpendicular to the main flat of a (100) wafer. In between the contact strips are empty regions 5 where there is no ohmic metal and no non-single-crystalline layers for that matter. It is indeed possible to use a process other than lift-off to form the long ohmic contacts 4. For example, a subtractive process consisting of an ohmic metal deposition and then an etch patterning step or steps could be used. After the contact strips 4 are made, the substrate undergoes an anneal at a temperature of approximately 400 degrees Celsius to aid the adhesion of the contact and improve the ohmic contact properties.

Figure 5:
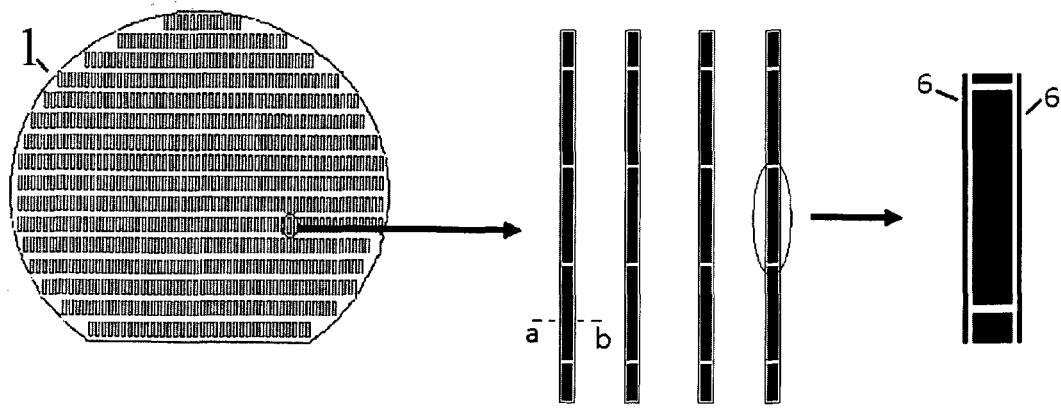
FIG. 5 is a view of the alignment of masking material over the top-side ohmic metal contact strips.

Next, a masking material (For example, photoresist can be used.) is deposited over these contact strips as well as in the area between the strip ends 5 to provide a mask for etching used to form the semiconductor ridges. The edges of this mask 6 are shown in FIG. 5. A suitable wet etch process could consist of room temperature solutions of water (H2O): hydrogen peroxide (H2O2): sulfuric acid (H2SO4) in a ratio of 20:1:1 and concentrated hydrochloric acid (HCl) to etch InGaAs and InP, respectively. It is indeed possible to use a process other than a wet etch to form the semiconductor laser ridge. For instance, a dry etch technique such as reactive ion etching could be used.

Figure 8:
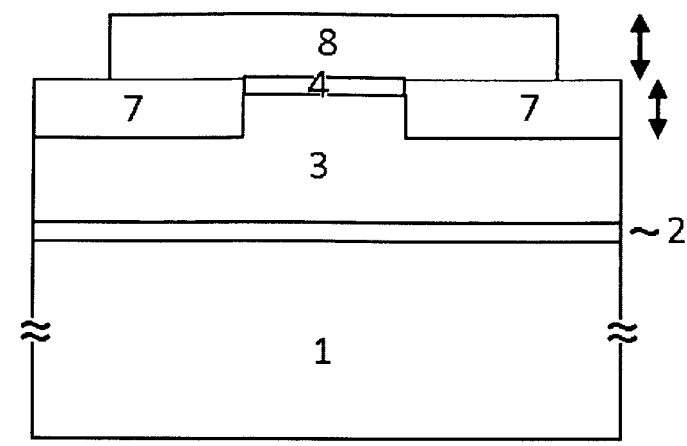
FIG. 8 is a view of the cross section taken at the line a-b shown in FIG. 7.

Device planarization then involves spinning multiple coats of Benzocyclobutane (BCB) 7 on top of the device structure and curing at temperatures as high as 250 degrees Celsius for a couple of hours in a Nitrogen ambient. The BCB 7 is then uniformly reactive ion etched with an oxygen (O2): sulfur hexafluoride (SF6) in a 6:1 ratio chemistry at a pressure of 200 mtorr and an RF power of 150 W just until the metal ridge contact is exposed. Other insulators (For example, spin-on-glass.) could be used instead of BCB. Next, a large area, greater than 200 nm thick gold based electrical contact 8 is formed on top of the ridge by lift-off (FIG. 7 and FIG. 8).

Figure 9:
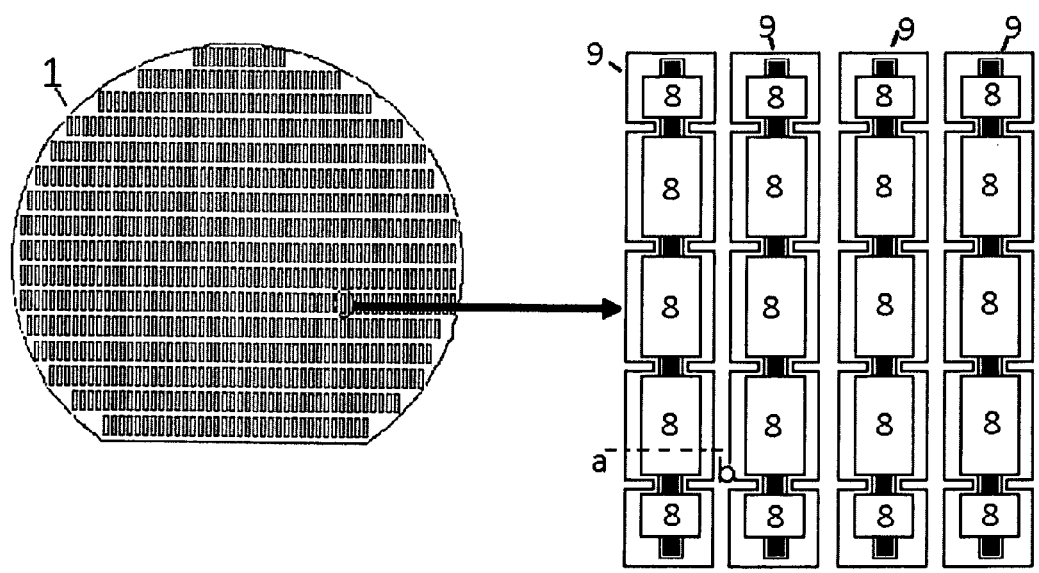
FIG. 9 is a schematic of a cleaved facet enabling pattern where an array of bars pattern 9 is aligned with the cleavage plane of a semiconductor substrate and etched into the laser structure.
Figure 10:
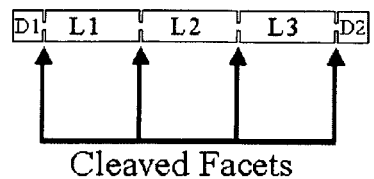
FIG. 10 is a view of a cleaved facet enabling bar pattern 9 and labeling of the sub-bars. The rectangular sub-bars, labeled L1, L2 and L3, correspond to desired active optical devices. The square sub-bars, labeled D1 and D2, denote dummy devices.

At this juncture, the formation of the pattern that will ultimately allow the precise facet cleaving to occur is incorporated. An embodiment of the facet cleaving enabling pattern is shown in FIG. 9. In this embodiment, a masking material is deposited and patterned in an array of rectangular bars pattern 9 whereby each rectangular bar overlays the semiconductor ridges formed in the front-side processing of the device. The short and long faces of this pattern are aligned with the two cleavage planes. Upon closer examination, these rectangular bars have notches which divide each long bar into three rectangular sub-bars in between two smaller square sub-bars as is shown in FIG. 10. The depiction of three long sub-bars and two smaller sub-bars is just an example. It is possible to use other numbers of long and/or small sub-bars or any combination of long and small sub-bars. It is possible to use sub-bars, all having the same length. The exposed BCB is etch removed and then the laser structure is etched down to the InGaAs intermediate layer 2 using this bar pattern 9 as an etch mask. The InP-based semiconductor can be etched using a chlorine and silicon tetrachloride based reactive ion etch.

The alignment of this bar pattern 9 is critical so that the devices are protected and the desired cleave locations are designated appropriately. The mask material used for 9 can be a chosen from a multitude of materials such as a dielectric like silicon dioxide or photoresist, and can be deposited, grown, or spun on.

As shown in FIG. 10, the rectangular sub-bars, labeled L1, L2 and L3, correspond to desired active optical devices. The small sub-bars, labeled D1 and D2, denote dummy devices. The distinguishing feature between the dummy devices and desired active optical devices ultimately produced will be the number of cleaved facets. The desired devices will have two cleaved facets, while dummy devices will have one cleaved facet and one etched facet. A critical element of the process is to control the dimensions of the long rectangular bar so that its length:width:thickness aspect ratio does not far exceed 300:15:1 and individual sub-bar dimensions do not have a length:width:thickness aspect ratio more extreme than 100:15:1. This is to prevent device warping.

Figure 11:
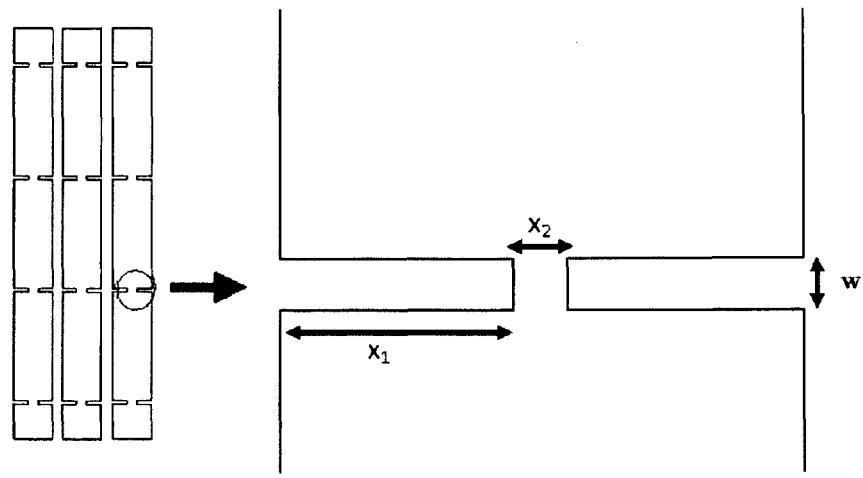
FIG. 11 is a close-up view of a cleaved facet enabling bar pattern 9 and labeling of the appropriate notch dimensions.

The bar notches are used to reduce the length over which cleaving must take place to achieve a cleaved facet, thus increasing the likelihood that cleaving will both occur in this region and produce a smooth facet. The precision in terms of the location where the actual cleave takes place is enhanced by making this notch as narrow and as long as possible. In other words, by making x2 and w narrow, as is shown in FIG. 11 There is a limit to how narrow x2 can be made due to the fact that an optical waveguide must reside in this region.

Figure 12:
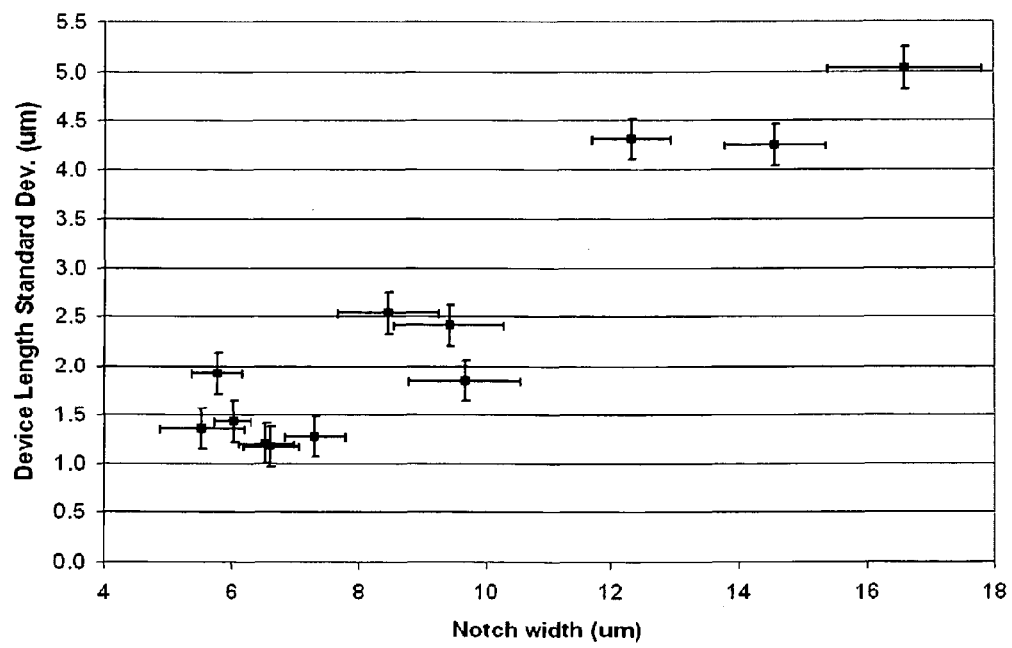
FIG. 12 is a plot of the device length standard deviation vs. notch width. Horizontal error bars account for notch width variation specific to each sample. Vertical error bars correspond to the measurement repeatability of 0.21 microns.

Just by decreasing the notch width, w, it is possible to improve the precision with which the cleave location is made. FIG. 12 shows the results of an experiment whereby several samples, each with a different bar notch width were fabricated and then the cleaving operation was performed. Notch widths and cavity lengths of these cleaved bars were measured using a Carl Zeiss AxioSkop microscope system outfitted with an AxioCam MRc digital camera and the AxioVision digital imaging software. The specific experimental protocol followed for each sample involved first measuring the realized notch widths of fifteen different bars from the same sample process run. Averaging these fifteen notch widths, an estimate was made for the notch width of that sample. With the sample notch width estimated, the cavity lengths of ten different cleaved bars from that sample were then measured. The results of this experiment show a trend toward more uniform device lengths as the notch width, w, is narrowed.

An important element of the invention is that it must be ensured that the notch regions are devoid of non-single-crystalline materials, such as planarization layers and metals. In contrast to single crystal materials, non-single-crystalline materials do not cleave easily. The use of these materials inhibits cleaving outside the notch region. FIG. 13 details the alignment between the semiconductor ridge (defined by pattern 6), the ridge ohmic metal contact 4, the large area top metal contact 8 and the cleave enabling bar pattern 9 for a cleaved ridge laser process. Note that along the length of the bars, only regions of length w2 within the notch regions have no non-single-crystalline material. By making this w2 narrower than the notch width, w, the precision of the cleaving process can be further improved.

Alternative embodiments of the cleave enabling pattern are shown in FIGS. 14B and 14C. FIG. 14A shows the first embodiment which is a rectangular bar pattern 9 with rectangular notches locating the position of the cleave. FIG. 14B is a view of a rectangular bar pattern 10 with v-shaped notches that are used to locate the position of the cleave. FIG. 14C shows a rectangular bar pattern 11 with no notches.

Figure 15:
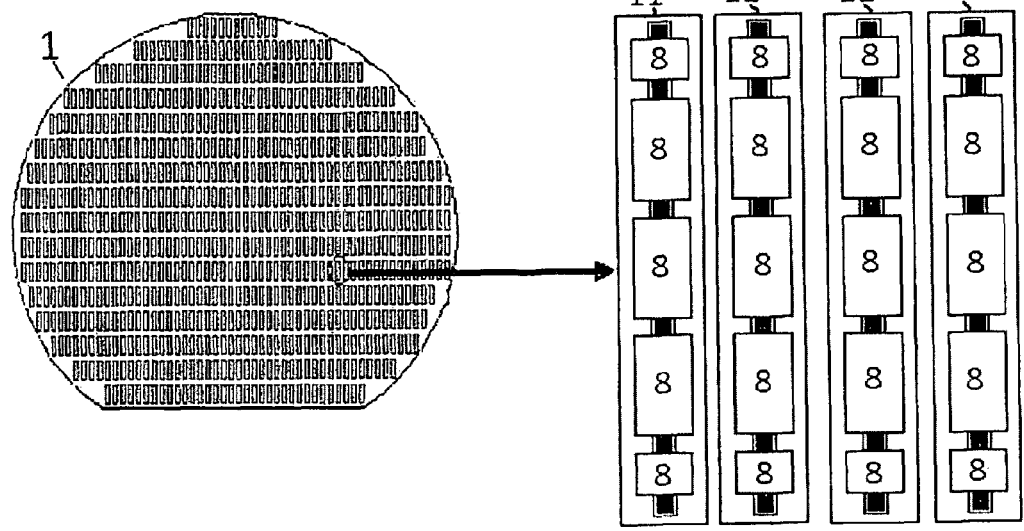
FIG. 15 is a top-down close-up view of a cleaved facet enabling bar pattern 11 with no notches shown in FIG. 14C applied to an edge emitting ridge laser.

The facet cleaving pattern 11 shown in FIG. 14C, applied to the process for manufacturing an edge emitting laser platelet is shown in FIG. 15 whereby a rectangular pattern 11 of non-single-crystalline masking material such as a metal or a dielectric is formed (e.g., deposited and patterned or selectively formed) over the area that was patterned during front-side device processing. There is no notch pattern in this rectangular pattern. Therefore, the cleaving will ultimately be confined to the regions of no non-single-crystalline material defined by the device fabrication.

Figure 16:
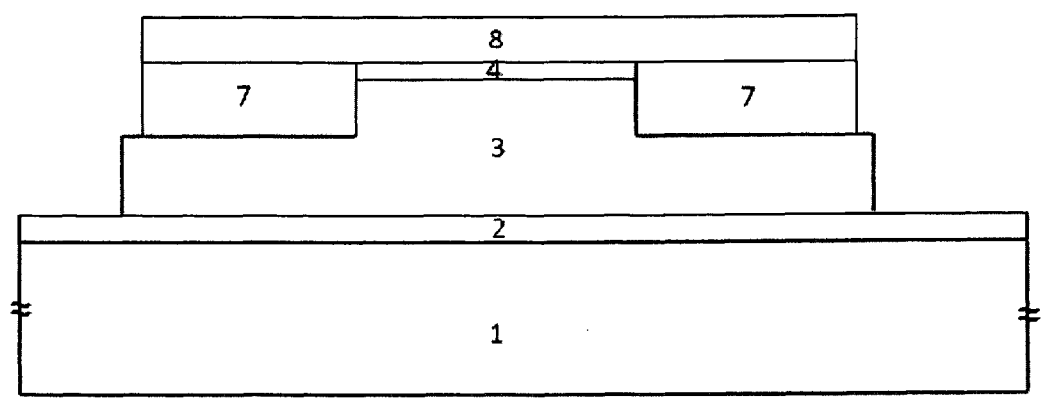
FIG. 16 is a cross-sectional view of a bar in the area a-b shown in FIG. 9 after the frontside device processing is complete.

Using this mask, the wafer front-side is etched down to the etch-stop, intermediate layer 2. This step includes the dry etching of the visible BCB using the aforementioned BCB dry etch chemistry as well as the InP-based semiconductor etch which can consist of chlorine and silicon tetrachloride reactive ion etches. The mask is then removed. This simplifies the alignment process significantly. Precise location of the facet cleave requires careful positioning of the large area electrical contact 8 and ohmic contact strips 4. By keeping the gaps 5 between the adjacent ends of ohmic contact strips and/or the adjacent ends of the large area electrical contacts narrow, precise location of the facet cleaves is possible. At this stage, the front-side device processing has resulted in a device cross-sectional structure as shown in FIG. 16.

Figure 17:
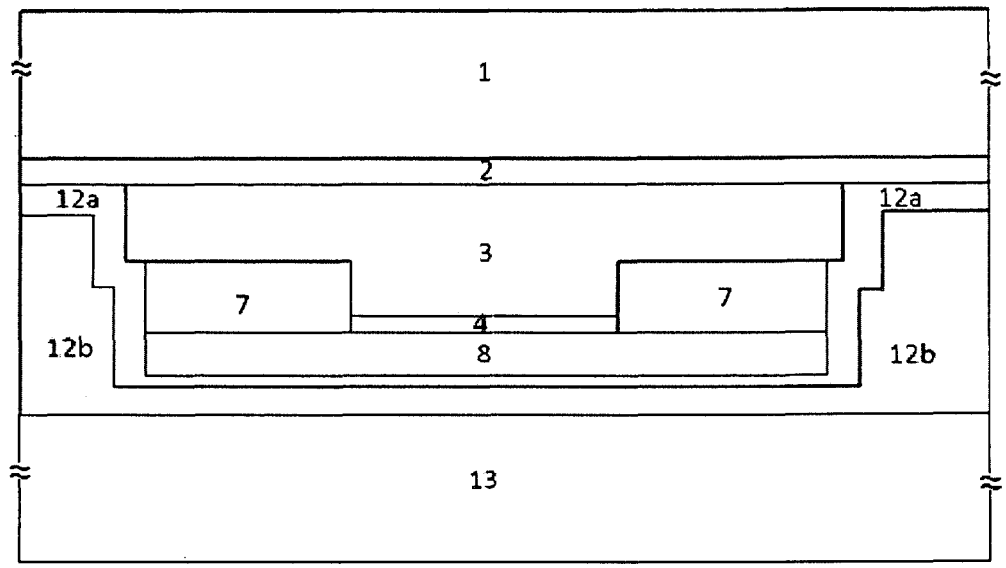
FIG. 17 is a cross-sectional view of a bar in the area a-b shown in FIG. 9 mounted face down on a carrier substrate 13.
Figure 18:
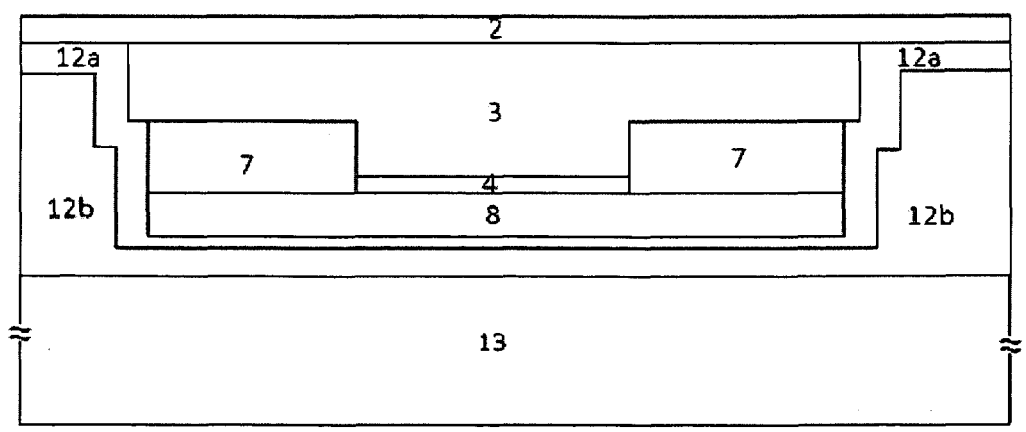
FIG. 18 is a cross-sectional view of a bar in the area a-b shown in FIG. 9 after the semiconductor substrate 1 is removed.
Figure 19:
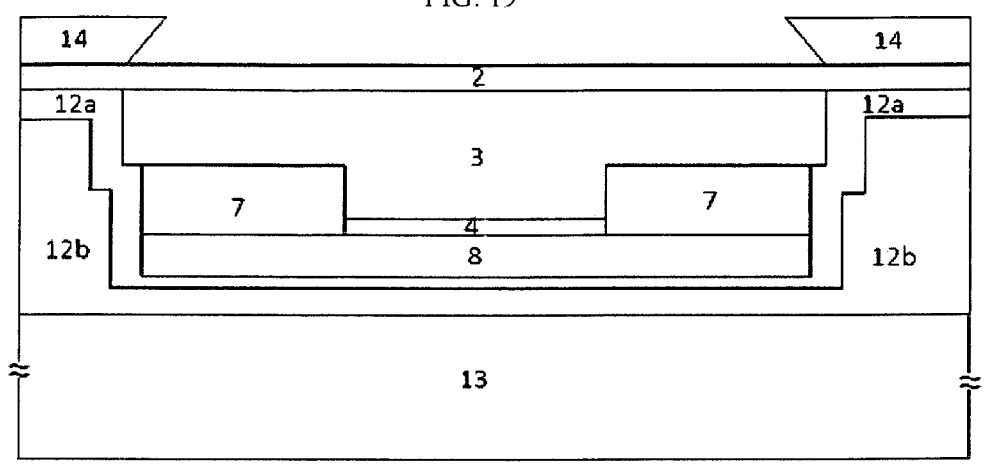
FIG. 19 is a cross-sectional view of a bar in the area a-b shown in FIG. 9 after the backside contact photolithography exposure and development.
Figure 22:
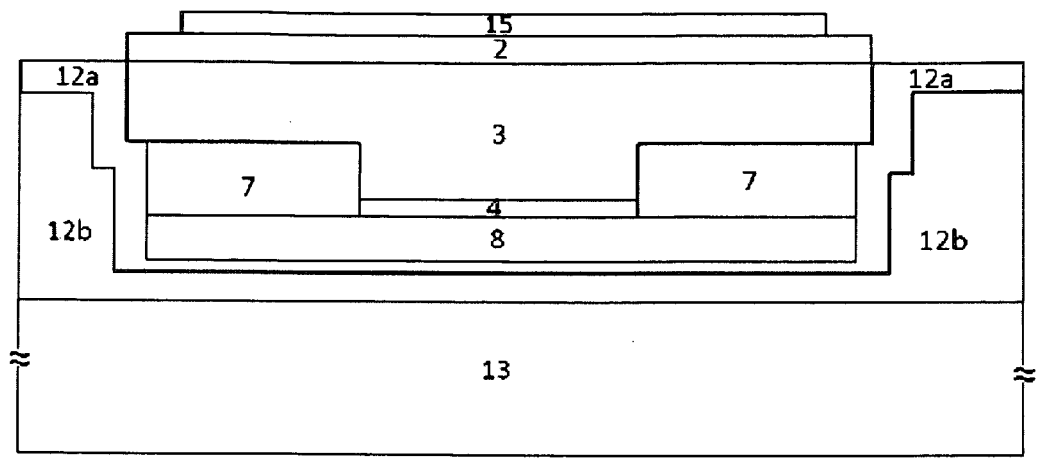
FIG. 22 is a cross-sectional view of a bar in the area a-b shown in FIG. 9 after the backside InGaAs intermediate layer 2 etch.

After the cleave enabling bar pattern is transferred to the wafer front-side, back-side device processing commences (FIG. 17). Back-side processing first requires the coating of the wafer front-side with a protective layer 12a to shield the devices from the harsh chemicals and processes that will be used to remove the substrate 1 or release the devices from their substrate. For this work, Brewer Science Wafer-BOND™ is used as this protective layer 12a. A suitable process for removing the substrate 1 involves mounting the sample front-side down on a rigid substrate 13 using an Apiezon wax 12b. As shown in FIG. 18, the Indium Phosphide substrate 1 is removed using a concentrated HCl wet etch that selectively stops on the InGaAs intermediate layer 2 which was situated between the epitaxial laser structure and the native semiconductor substrate. It is possible to use other etch techniques, such as dry etching, to remove the semiconductor substrate. Then, photolithography, ohmic metal deposition and liftoff processes are used to make a back-side Ni (5 nm thick)/Au (10 nm thick)/Ge (60 nm thick)/Au (90 nm thick)/Ni (30 nm thick)/Au (200 nm thick) electrical contact to then-type region of the laser (See FIG. 19, 20, 21). The exposed InGaAs intermediate layer 2 is then mostly removed (FIG. 22) using a wet etch such as the solution of H2SO4, H2O2, and H2O mentioned earlier. It should be noted that it is conceivable to grow the laser n-type material up instead of the p-type up as explained here. This would simply reverse the order of the metallizations already described.

Figure 23:
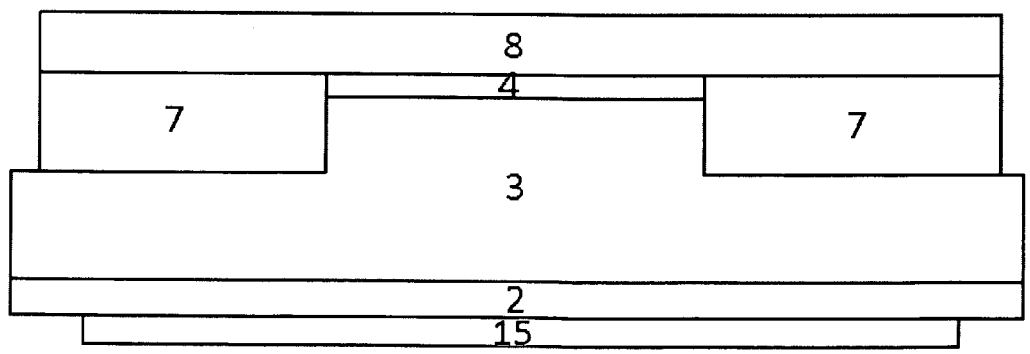
FIG. 23 is a cross-sectional view of a bar in the area a-b shown in FIG. 9 after being released from the carrier substrate 13.

With all back-side processing completed, the Wafer-BOND™ polymer 12a holding the bars is then dissolved using the WaferBOND™ remover proprietary solvent, thus releasing the long bars (as shown in FIG. 10) onto a teflon collection substrate. In contrast to other possible collection substrates such as polished silicon, teflon, with its characteristic rough surface, does not result in strong adhesion to the released bars when the fluid surrounding the cleaved bars evaporates. A cross-sectional view of a bar is shown in FIG. 23.

Next, the bars are cleaned using individual rinse and decant processes with acetone, methanol, and isopropanol. Upon completion of the cleaning process, the bars are left resting on the Teflon substrate in a glass container filled with isopropanol. At this time, the vessel containing the bars in solution is agitated ultrasonically causing the bars to preferentially cleave in the notch regions, thus forming the facets of the edge emitting laser platelets.

Figure 24:
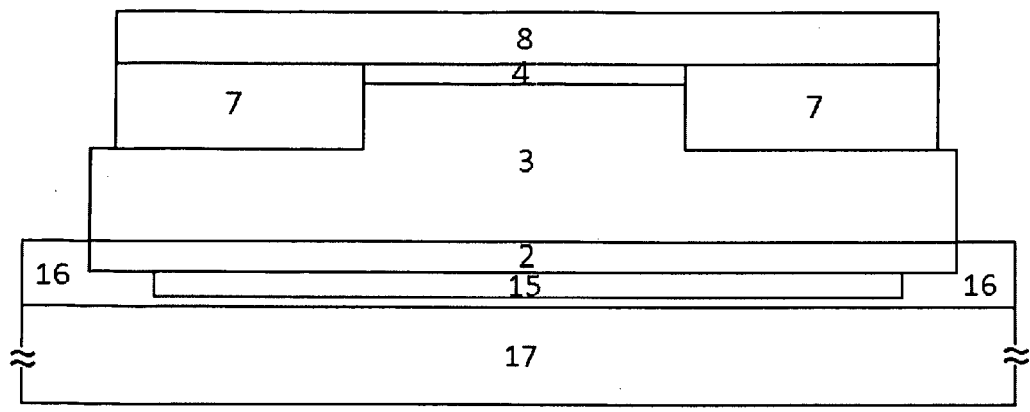
FIG. 24 is a cross-sectional view of cleaved device in the area a-b shown in FIG. 9 after metal to metal bonding to the silicon target substrate 17.

Individual laser platelets can then be transported from the teflon sheet to the desired location for integration using micro-scale pick and place assembly. The micro-scale pick and place assembly tool consists of a microscope and a narrow (e.g., 20 microns) opening glass micropipette that is connected to a three-axis micro-positioning stage (Teo, S. M. Thesis, Dept. of Elect. Eng. and Comp. Sci., MIT, (2005)). A vacuum is connected to the micro-pipette which creates a suction force on the cleaved active optical device bars when the pipette approaches them. The end of the micro-pipette is beveled so that its tip is flush with the bar. Other higher volume techniques, such as fluidic assembly, could also be used for the assembly process. Once the bar is placed on the integration substrate, a thermo-compressive bonding process (using a chamber described in Teo, S. M. Thesis, Dept. of Elect. Eng. and Comp. Sci., MIT, (2005)) is undertaken. A cross-sectional view of an edge emitting laser platelet bonded to a silicon substrate 17 is shown in FIG. 24. A bonding material such as indium or more preferably gold-tin (having a thickness of a couple hundred to several hundred nanometers) is used as the bonding layer between the metal contact to the target substrate and the laser device. Naturally, if these lasers are to be integrated with silicon electronics, a barrier metal would be used also to prevent gold movement into the silicon.

Figure 25:
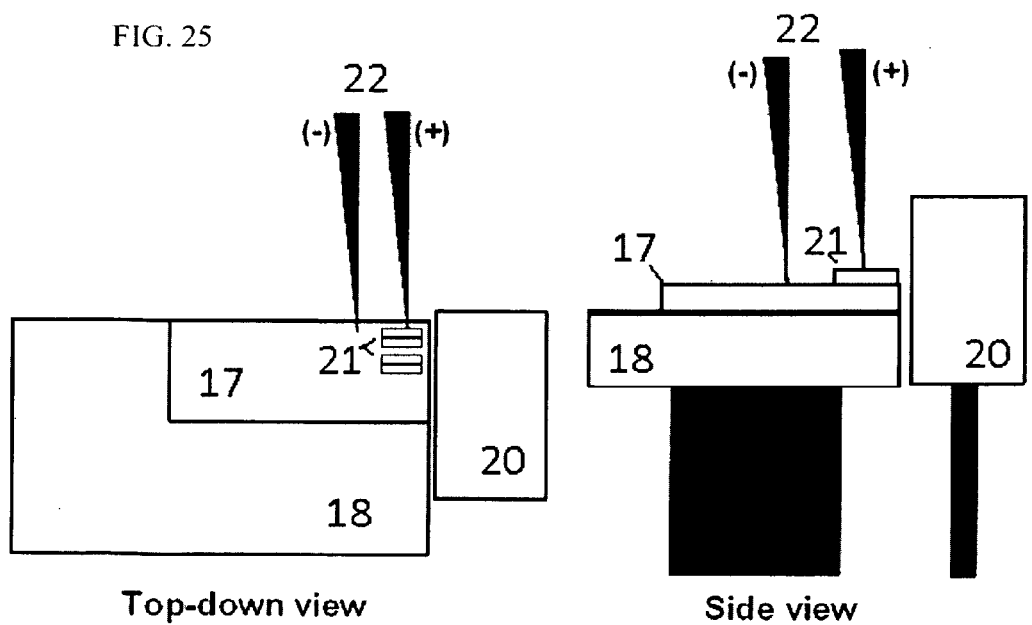
FIG. 25 is the test setup for the edge emitting laser light output characterization.
Figure 26:
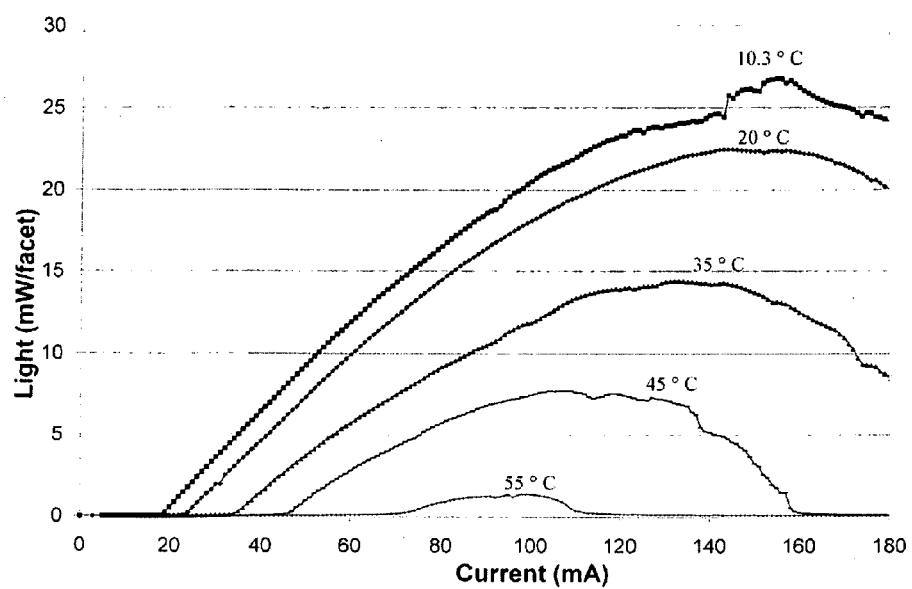
FIG. 26 is a plot showing the continuous-wave light output as a function of drive current measured at a number of different stage temperatures of a cleaved ridge laser platelet on silicon. Inset: Optical spectrum of a cleaved ridge laser platelet on silicon at a drive current of 30 mA and at room temperature.
Figure 26:
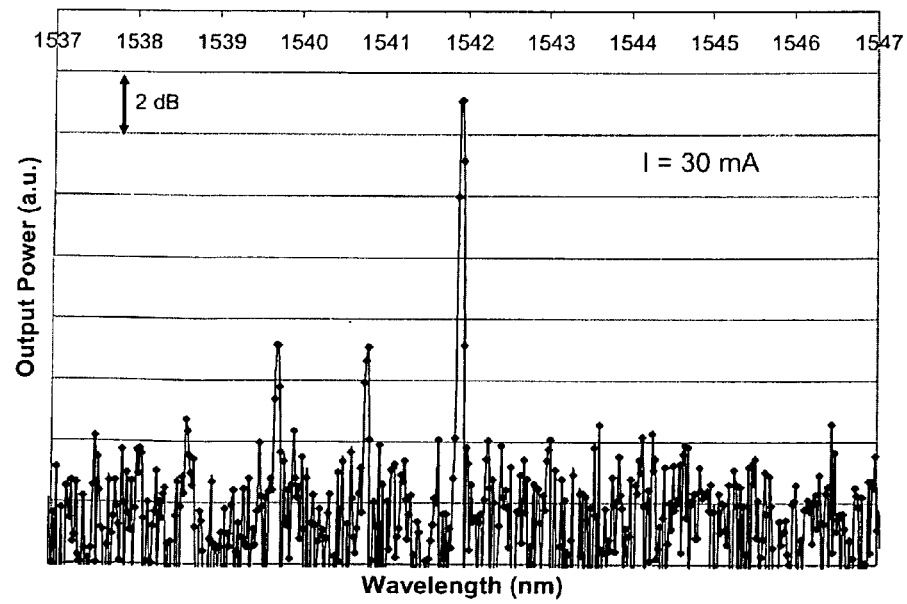

Devices 21 fabricated in the above described manner and bonded on a silicon substrate lase in a continuous-wave fashion when forward bias probed electrically with probes 22 connected to a DC current source. Continuous-wave characterization of such cleaved ridge lasers on silicon was performed with the silicon substrate 17 mounted on a temperature-controlled stage 18 at the end of which was situated a large area long wavelength photodetector 20 (See FIG. 25.). FIG. 26 shows the continuous-wave light output characteristics of a typical micro-cleaved laser on silicon at several stage temperatures. For this device, output powers as high as 26.8 mW (at T=10.3 degrees Celsius) were detected and the device lased at stage temperatures as high as 55 degrees Celsius. At a stage temperature of 20 degrees Celsius, the peak differential external quantum efficiency, $\eta_d$, was measured to be 73%; at 10.3 degrees Celsius, it was 81%.

The output emission spectrum measured just above threshold at a drive current of 30 mA is shown as an inset to FIG. 26 and reveals an output emission peak just below 1542 nm, and a Fabry Perot mode spacing of 1.1 nm, consistent with a group index of approximately 3.6.

Pulsed lasing (1 kHz repetition rate, 0.45% duty cycle) was measured to a temperature of at least 80 degrees Celsius, the temperature limit of the thermoelectric cooler (TEC) used. A log-linear plot of the threshold current (pulsed) as a function of stage temperature yields a value for the characteristic temperature, $T_0$, of 42.9 K.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

What is claimed is:

1. A device comprising:
   a semiconductor layer structure having a first cleaved facet;
   a first electrical contact to said semiconductor layer structure;
   wherein a substrate on which said semiconductor layer structure was grown has been substantially removed; and
   wherein a combined thickness of said semiconductor layer structure and said first electrical contact is less than ten microns.

2. The device according to claim 1, wherein said device is a continuous-wave edge emitting laser.

3. The device according to claim 1, further comprising:
   a second electrical contact to said semiconductor layer structure;
   wherein said first and second electrical contacts are formed prior to a time when said first cleaved facet is formed;
   wherein said first electrical contact is formed at a time before said substrate has been substantially removed;
   wherein said second electrical contact is formed at a time after said substrate has been substantially removed;
   wherein said first cleaved facet is formed at a time after said substrate has been substantially removed;
   wherein said semiconductor layer structure includes an intermediate layer that is grown adjacent to said substrate; and
   wherein a portion of said intermediate layer on said device is removed at a time before forming said second electrical contact.

4. The device according to claim 1, further comprising:
   a second electrical contact to said semiconductor layer structure;
   wherein said first and second electrical contacts are formed prior to a time when said cleaved facet is formed;
   wherein said first electrical contact is formed at a time before said substrate has been substantially removed; and
   wherein said second electrical contact is formed at a time after said substrate has been substantially removed.

5. The device according to claim 1, further comprising a second cleaved facet and
   a second electrical contact to said semiconductor layer structure;
   wherein said first and second electrical contacts are formed prior to a time when said first and second cleaved facets are formed; and
   wherein said device has an aspect ratio corresponding to a length: said combined thickness greater than 100:1.

6. The device according to claim 1, wherein said first cleaved facet is an ultrasonically cleaved facet.

7. A device comprising:
   a semiconductor layer structure, wherein said layer structure has a first cleaved facet;
   a first electrical contact to said semiconductor layer structure;
   wherein a substrate on which said semiconductor layer structure was grown has been substantially removed;
   wherein a combined thickness of said semiconductor layer structure, said first electrical contact, and any remaining portion of said substrate is less than fifty microns.

8. The device according to claim 7, wherein said first electrical contact is formed at a time prior to when said first cleaved facet is formed.

9. The device according to claim 7, wherein said device is a continuous-wave edge emitting laser.

10. The device according to claim 7, wherein said device is a semiconductor optical amplifier.

11. The device according to claim 7, further comprising:
    a second electrical contact to said semiconductor layer structure;

wherein said first and second electrical contacts are formed prior to a time when said first cleaved facet is formed;

wherein said first electrical contact is formed at a time before said substrate has been substantially removed; and wherein said second electrical contact is formed at a time after said substrate has been substantially removed.

12. The device according to claim 7, further comprising a second cleaved facet and a second electrical contact to said semiconductor layer structure.

13. The device according to claim 7, wherein said first cleaved facet is an ultrasonically cleaved facet.

14. A device comprising:
a semiconductor layer structure having a cleaved facet;
an electrical contact to said semiconductor layer structure;
wherein a substrate on which said semiconductor layer structure was grown has been substantially removed;
wherein a combined thickness of said semiconductor layer structure, said electrical contact, and any remaining portion of said substrate is less than ten microns; and
wherein said device is rectangular shaped.

15. The device according to claim 14, wherein said device is a continuous-wave edge emitting laser.

16. The device according to claim 14,
wherein said cleaved facet is formed at a time after said substrate has been substantially removed; and
wherein said electrical contact is formed prior to a time when said cleaved facet is formed.

17. The device according to claim 14,
wherein said electrical contact is formed prior to a time when said cleaved facet is formed;
wherein said semiconductor layer structure includes an intermediate layer that is grown adjacent to said substrate; and
wherein a portion of said intermediate layer on said device is removed.

18. The device according to claim 14, further comprising,
a second cleaved facet; and
a second electrical contact to said semiconductor layer structure;
wherein said electrical contacts are formed prior to a time when said first and second cleaved facets are formed.

19. The device according to claim 14, wherein said cleaved facet is an ultrasonically cleaved facet.

20. The device according to claim 14, wherein said device has an aspect ratio corresponding to a length: said combined thickness greater than 100:1.

* * * * *